(12) United States Patent
Kim et al.

(10) Patent No.: US 7,721,423 B2
(45) Date of Patent: May 25, 2010

(54) METHOD OF MANUFACTURING ALLOY CIRCUIT BOARD

(75) Inventors: Young-Jae Kim, Suwon-si (KR); Jae-Woo Joung, Suwon-si (KR); Young-Seuck Yoo, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 127 days.

(21) Appl. No.: 11/902,049

(22) Filed: Sep. 18, 2007

(65) Prior Publication Data

US 2008/0066952 A1 Mar. 20, 2008

(30) Foreign Application Priority Data

Sep. 19, 2006 (KR) .................. 10-2006-0090719

(51) Int. Cl.
*H05K 3/20* (2006.01)
*H05K 1/09* (2006.01)

(52) U.S. Cl. .................. 29/831; 29/830; 29/832; 29/837; 29/838; 174/257

(58) Field of Classification Search .......... 29/830, 29/831, 832, 837, 838, 846; 216/27; 347/68–70; 174/257; 419/7; 427/96.1, 96.2, 451, 455, 427/528, 531, 564
See application file for complete search history.

(56) References Cited

U.S. PATENT DOCUMENTS 4,327,124 A 4/1982 DesMarais, Jr.
5,857,883 A * 1/1999 Knickerbocker et al. ...... 445/23
5,958,145 A * 9/1999 Yonemizu et al. .............. 134/2
6,378,199 B1 * 4/2002 Yoshinuma et al. .......... 29/830
2004/0142165 A1 * 7/2004 Fujii et al. .................. 428/328

FOREIGN PATENT DOCUMENTS

| CN | 1719966 A | 1/2006 |
|---|---|---|
| JP | 2005-340437 | 12/2005 |
| JP | 2006-128239 | 5/2006 |
| KR | 10-2005-0027003 | 3/2005 |

OTHER PUBLICATIONS

Korean Patent Office Action issued in corresponding Korean Patent Application No. 10-2006-0090719.
Japanese Office Action issued Dec. 8, 2009 in corresponding Japanese Patent Application 2007-242498.

* cited by examiner

*Primary Examiner*—Derris H Banks
*Assistant Examiner*—Tai Nguyen

(57) ABSTRACT

A method of manufacturing an alloy circuit board including an alloy circuit made of an alloy of first metal particles and second metal particles includes forming a first circuit layer, by printing ink containing first metal particles on a board; stacking a second circuit layer on the first circuit layer, by printing ink containing second metal particles on the board; and sintering the first circuit layer and the second circuit layer by heating so as to form the alloy of the first metal particles and the second metal particles.

10 Claims, 5 Drawing Sheets

METHOD OF MANUFACTURING ALLOY CIRCUIT BOARD

CROSS-REFERENCE TO RELATED APPLICATIONS

This application claims the benefit of Korean Patent Application No. 10-2006-0090719 filed with the Korean Intellectual Property Office on Sep. 19, 2006, the disclosure of which is incorporated herein by reference in its entirety.

BACKGROUND

1. Technical Field

The present invention relates to a method of manufacturing an alloy circuit board.

2. Description of the Related Art

These days, there are ongoing advances in inkjet technology, and a wide range of research efforts are focused on methods of using inkjet printing in processes involving color filters, printed circuit boards (PCB's), etc. However, despite the developments in ink in which pure particles are synthesized, such as silver ink and copper ink, etc., it is difficult to synthesize two types of ink, and control is not easy at the particle level.

There is as yet no technology for forming alloy circuits using inkjet technology, but as shown FIG. 1 and FIG. 2, there is a method of using ALD (Atomic Layer Deposition) in the semiconductor process to form an alloy thin film. The principles and processes of this technology are as follows.

To form an alloy thin film using ALD (Atomic Layer Deposition), a board is placed in a vacuum chamber and sources are selected that supply each element for the desired alloy, after which the elements are flowed into the chamber per cycle and plasma is generated to form an element atomic layer.

For example, a silver atomic layer may first be formed by flowing silver in, generating plasma on the board and depositing the silver particles. Then, in the next cycle, lead may be flowed in and plasma may be generated to form an atomic layer of lead as a second atomic layer. The cycles may be repeated to form a pattern of a desired thickness, after which thermal treating may be applied to form a AgPd alloy thin film.

However, the above method is for forming thin films in the order of nanometers, and requires additional devices such as the vacuum chamber and plasma generator. It is an expensive process, and also consumes too much time to be applicable to forming circuits of micrometer-level thickness. Furthermore, due to the inconvenience in having to prepare additional masks for selective deposition in order to form circuit patterns at particular positions, this method is virtually impossible to apply to forming circuits having a thickness of several micrometers.

SUMMARY

An aspect of the present invention is to provide a method of manufacturing an alloy circuit board, with which a desired alloy circuit can be formed to a predetermined thickness without using alloy ink, and no additional devices are necessary, and with which an alloy circuit can be formed in a short time by an inexpensive process without the use of masks.

One aspect of the invention provides a method of manufacturing alloy circuit board, which includes forming a first circuit layer, by printing ink containing first metal particles on a board in correspondence to a circuit pattern; stacking a second circuit layer on the first circuit layer, by printing ink containing second metal particles on the board; and sintering the first circuit layer and the second circuit layer.

Forming the first circuit layer and/or forming the second circuit layer may be performed by inkjet printing. Also, forming the first circuit layer and/or forming the second circuit layer may include drying the ink.

The forming of the first circuit layer and/or the second circuit layer may be repeated sequentially, prior to the sintering, to form the circuit patterns to a predetermined thickness. The forming of the first circuit layer and/or the second circuit layer may be repeated multiple times.

Also, the thickness of the first circuit layer and/or the second circuit layer may be 100 to 1,000 nm. The sintering may include heating the first circuit layer and the second circuit layer to a temperature of 200 to 400° C.

Also provided is an alloy circuit board that includes a board, and an alloy circuit printed on the board, where the alloy circuit is formed by sintering, after repeatedly printing ink containing first metal particles and ink containing second metal particles on the board.

Additional aspects and advantages of the present invention will be set forth in part in the description which follows, and in part will be obvious from the description, or may be learned by practice of the invention.

DETAILED DESCRIPTION

The alloy circuit board and manufacturing method thereof according to certain embodiments of the invention will be described below in more detail with reference to the accompanying drawings, in which those components are rendered the same reference number that are the same or are in correspondence, regardless of the figure number, and redundant explanations are omitted.

Figure 1:
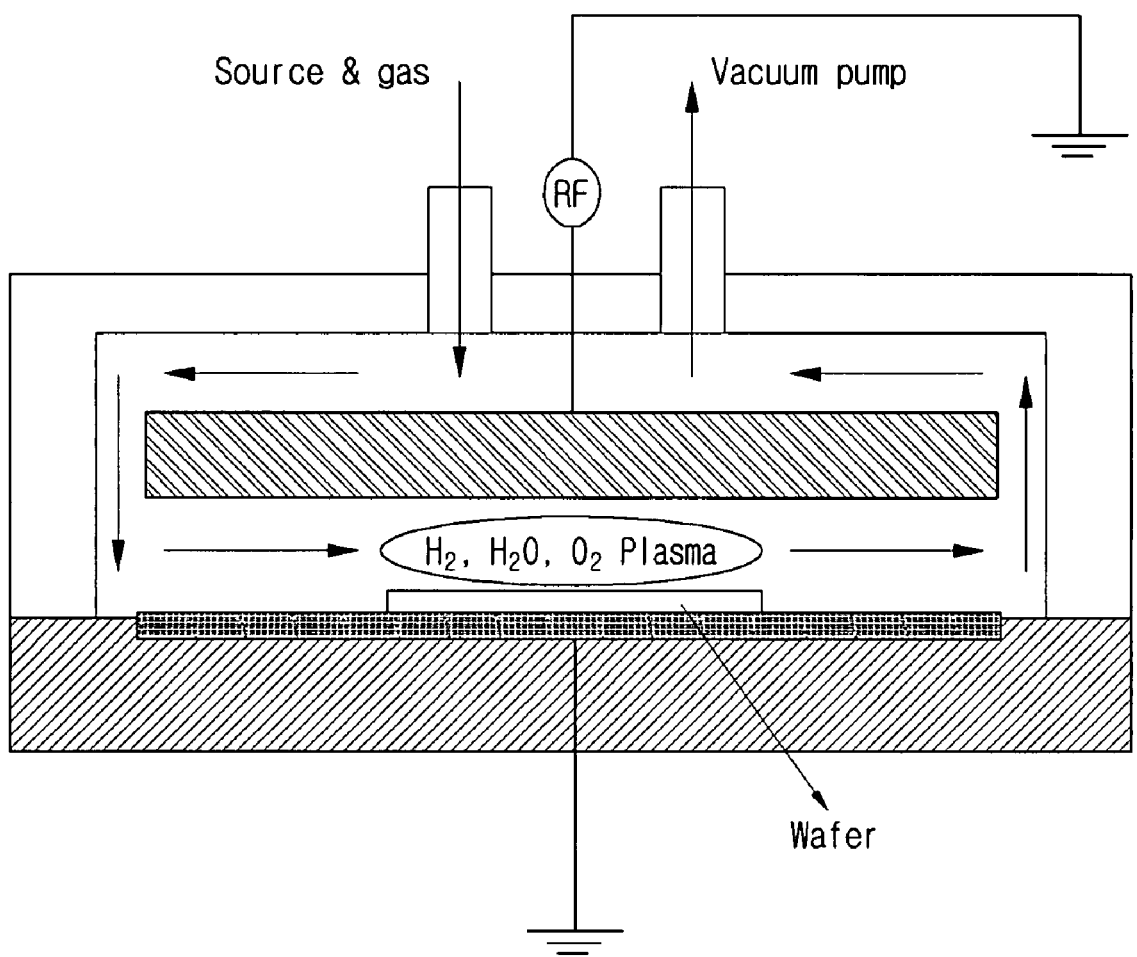
FIG. 1 is a schematic diagram illustrating an ALD device according to prior art.
Figure 2:
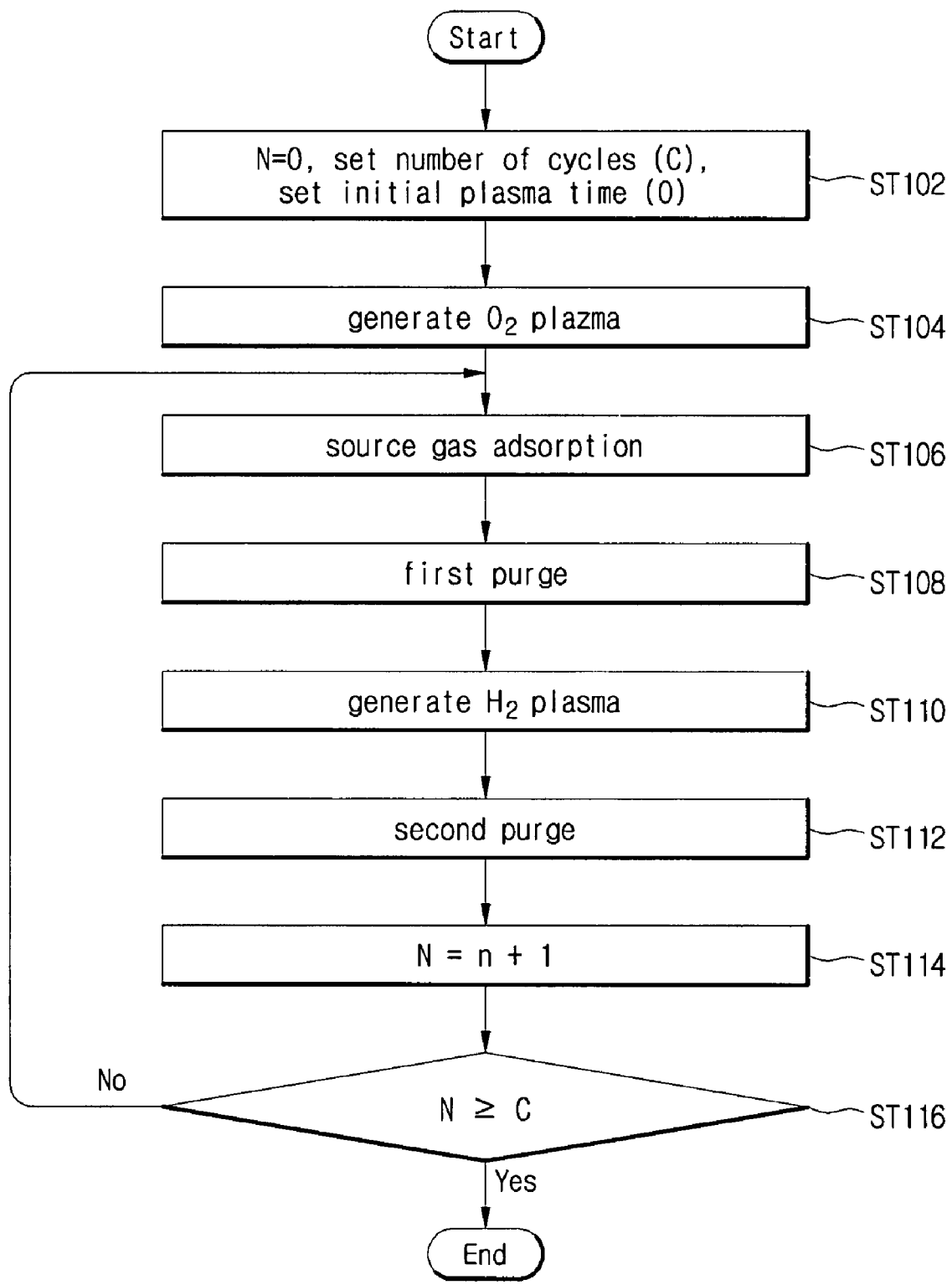
FIG. 2 is a flowchart illustrating a method of ALD according to prior art.
Figure 3:
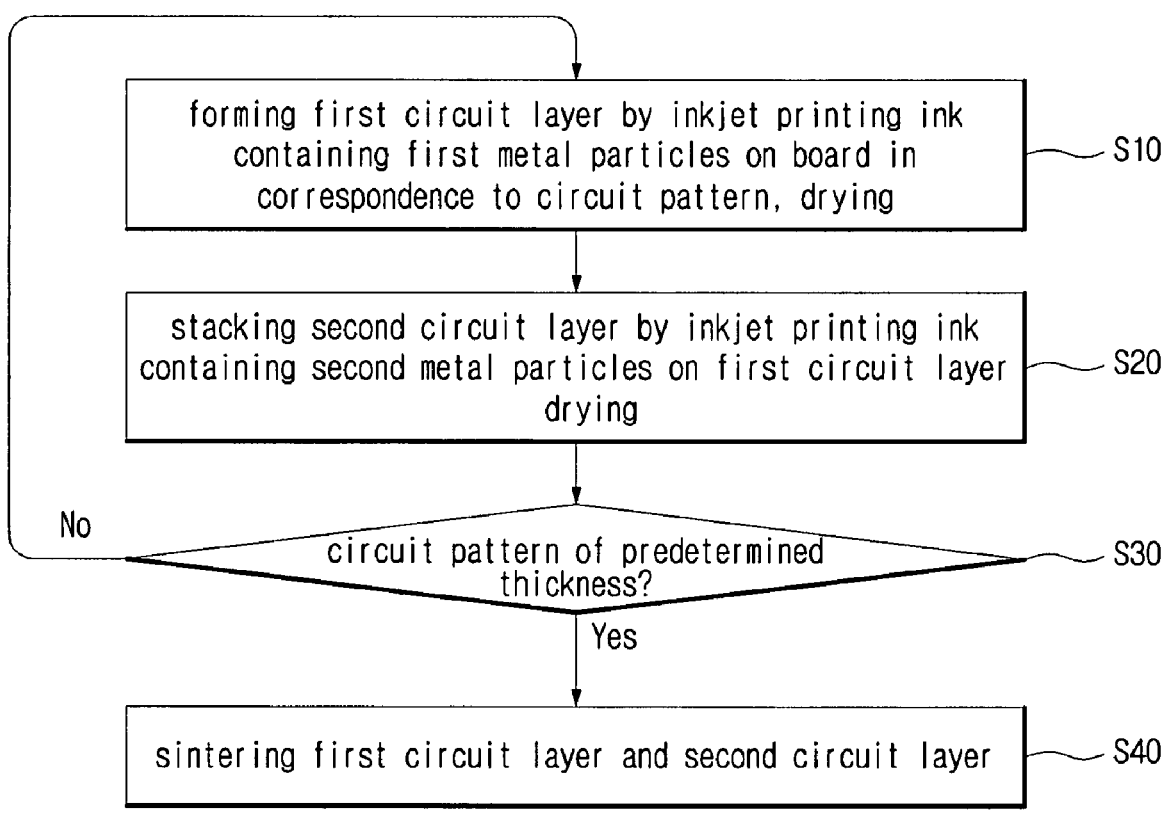
FIG. 3 is a flowchart illustrating a method of manufacturing an alloy circuit board according to an embodiment of the present invention.

FIG. 3 is a flowchart illustrating a method of manufacturing an alloy circuit board according to an embodiment of the present invention.

In operation S10, a first circuit layer may be formed by printing an ink, which contains first metal particles, on the board in correspondence to a circuit pattern, and then drying. As a method of printing ink containing metal particles on the board, this embodiment may use inkjet printing, in which ink contained in a pressure chamber is ejected in the form of droplets and shot onto the board.

If ink is printed on the board in this way by inkjet printing, a circuit layer may be formed, having a thickness of, for example, several hundreds of nanometers. This may correspond to the first circuit layer for an alloy circuit according to an aspect of the invention. After printing the first circuit layer to a predetermined thickness by inkjet printing, the first circuit layer may be dried, in order to prevent the mixing of the ink of the first circuit layer with the ink of the second circuit layer during the printing of the second circuit layer, whereby stacking effectiveness may be increased for the plurality of circuit layers alternately stacked in multiple layers.

The process of printing the first circuit layer does not have to be performed only once, but rather may be performed several times to obtain a circuit layer of a predetermined thickness. In this case also, it may be desirable to dry the ink after each instance of printing to increase effectiveness in stacking circuit layers.

In operation S20, a second circuit layer may be stacked on the first circuit layer by printing ink containing second metal particles on the portion of the board where the first circuit layer is printed. The process of stacking the second circuit layer may be performed by inkjet printing as in operation S10, and the ink may be dried after printing the second circuit layer for more effective stacking in subsequent printing processes.

After the first circuit layer is printed with ink containing first metal particles, the ink may be dried before printing the second circuit layer, to prevent the ink of each circuit layer from mixing with each other and causing the metal particles to be mixed due to a difference in density.

The second metal particles may be the metal particles which, together with the first metal particles, will be turned into the alloy via a sintering process, and may be activated by coupling with the first metal particles to form the alloy. Thus, the first metal particle and second metal particles may desirably be selected such that the two types of metal particles react and easily bond with each other in the sintering process described later to form the alloy of the alloy circuit board.

Also, the composition ratio of the first metal particles and second metal particles may be controlled such that a desired alloy can be formed. This is possible by controlling the ratio of metal particles contained in the ink, as well as by controlling the number of times an ink containing the same ratio of metal particles is printed on the board.

For example, if N times more of the first metal particles are needed than the second metal particles for an ideal combination, the processes of printing and drying the ink containing the first metal particles may be performed an N number of times and the processes of printing and drying the ink containing the second metal particles may be performed once, after which sintering may be performed to obtain an alloy of the desired composition.

In operation S30, an alloy circuit of a desired thickness may be formed alternately repeating the processes of stacking a first circuit layer and then stacking a second circuit layer. For example, if the thickness of the first circuit layer and second circuit layer is 100 nm each, in order to form an alloy circuit having a thickness of 10 μm, the first circuit layer and the second circuit layer can be stacked 50 times, and if the thickness of the first circuit layer and second circuit layer is 1 nm each, in order to form an alloy circuit having a thickness of 10 μm, the first circuit layer and the second circuit layer can be stacked 5 times.

However, according to the ratio of metal particles for forming the alloy, the number of times the first circuit layer and second circuit layer are stacked may be different, as already mentioned above.

That is, according to an embodiment of the present invention, stacking the first circuit layer on the board and then stacking the second circuit layer may be alternately repeated several times, where a process of stacking the first circuit layer stack an N number of times and a process of stacking the second circuit layer stack an M number of times may also be alternately repeated.

As mentioned above, after a circuit layer of a desired thickness is formed, in process S40, the first circuit layer and the second circuit layer are heated and sintered together, so that the first metal particles and second metal particles bond together and form an alloy circuit.

The sintering process is to activate the atoms of the metal particles stacked in layers with thermal energy by applying heat to the metal particles, so that they bond together as an alloy.

The temperature conditions for the sintering process can vary according to the sizes and types of the metal particles contained in the ink. For example, sintering may be performed at a temperature of 700 to 800° C. for bulk metal, whereas the temperature for the sintering process may be lower if the size of the particles is at a nanometer level, as in this embodiment. For example, silver (Ag) particles in the order of nanometers can be sintered at about 250° C., and other metal particles can also be sintered at temperatures of 200 to 400° C.

Through the sintering process, the atoms positioned at the bonding regions between the first circuit layers and second circuit layers according to this embodiment of the present invention may be activated, whereby the atoms may be firmly bonded to form the alloy, and the alloy may be formed easily.

Because the first circuit layer and the second circuit layer may be bonded by the sintering process, the method of forming the circuit layers according to this embodiment may include stacking the first circuit layer and second circuit layer in layers, and printing the circuit layers alternately, as already mentioned above.

Here, the thicknesses of the first circuit layer and second circuit layer may influence the degree to which the alloy may be formed. If the thickness of a circuit layer is thin, the degree of alloying will be comparatively high overall, whereas if the thickness of the circuit layer is thick, the degree of alloying obtained by the sintering will be lower, e.g. with the alloy being formed only in the bonding regions between the circuit layers.

On the other hand, the thinner the circuit layers, the greater the number of times of the ink printing, which may lead to longer process times and lower productivity, and thus there is a limit to how thin the circuit layers can be made for increasing the degree of alloying. For example, if a circuit layer is to be printed to a thickness of 100 to 1,000 nm, assuming that the total thickness of the circuit layers is 10 μm, the printing process may have to be repeated 10 to 100 times. Thus, it may be advantageous to print each of the circuit layers to a suitable thickness, in consideration of the degree of alloying between the first metal particles and the second metal particles and productivity.

The metal particles contained in the ink may be copper (Cu), silver (Ag), or palladium (Pd), etc., which are typically used in alloy circuits. While the above has described a method of forming an alloy circuit using two types of metal particles, it is also possible, according to an embodiment of the present invention, to form an alloy circuit using metal particles of three types or more, the only difference lying in repeatedly printing ink or three types or more in alternation, with the subsequent process applied just as that described above.

The second metal particles may be the metal particles which, together with the first metal particles, will be turned into the alloy via a sintering process, and may be activated by coupling with the first metal particles to form the alloy. Thus, the first metal particle and second metal particles may desirably be selected such that the two types of metal particles react and easily bond with each other in the sintering process to form the alloy of the alloy circuit board.

Thus, in the method of manufacturing an alloy circuit board according to a particular embodiment of the present invention as described with reference to FIG. 4, silver particles are used for the first metal particles, and palladium particles are used for the second metal particles.

Also, the composition ratio of the first metal particles and second metal particles may be controlled such that a desired alloy can be formed. This is possible by controlling the ratio of metal particles contained in the ink, as well as by controlling the number of times an ink containing the same ratio of metal particles is printed on the board. According to the embodiment of the present invention described with reference to FIG. 4, the silver particles and palladium particles contained respectively in each type of ink printed on the board are of the same ratio.

Figure 4:
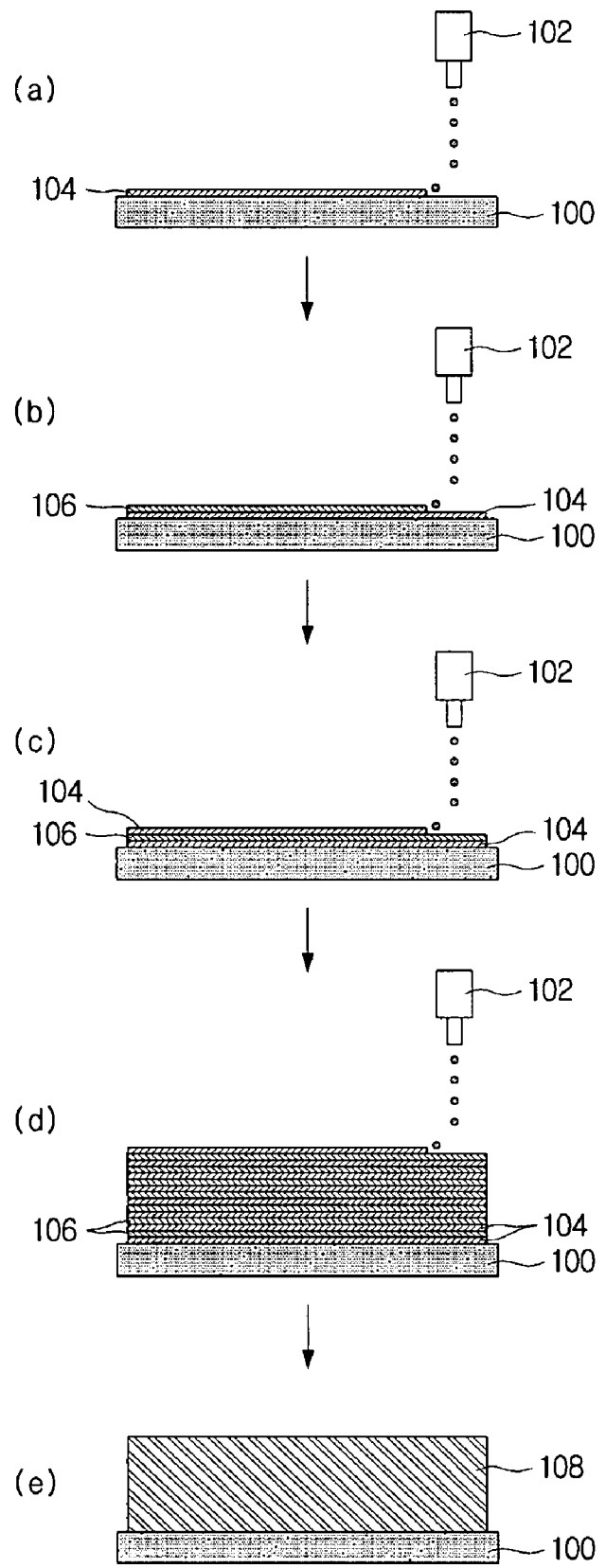
FIG. 4 is a flow diagram illustrating a process for manufacturing an alloy circuit board according to an embodiment of the present invention.

FIG. 4 is a flow diagram illustrating a process for manufacturing an alloy circuit board according to an embodiment of the present invention. In FIG. 4 are illustrated a board 100, an inkjet head 102, silver circuit layers 104, palladium circuit layers 106, and an alloy circuit board 108.

In this embodiment, an example is given in which the alloy circuit pattern is formed using silver (Ag) particles as the first metal particles and palladium (Pd) particles as the second metal particles. Other metal particles may be used besides silver or palladium Ag or Pd to implement this embodiment of the invention, as already mentioned above.

As in (a) of FIG. 4, ink containing the silver (Ag) particles may be printed on the board 100 in correspondence to the circuit patterns using an inkjet head 102, where, as mentioned above, inkjet printing may be used, in which ink contained in a pressure chamber is ejected in the form of droplets and shot onto the board.

After the silver circuit layer is stacked by printing ink containing silver particles, it is dried. This is to prevent the ink of the silver circuit layer 104 from being mixed with the ink that will be printed over it.

The palladium circuit layer 106 may be stacked on the silver circuit layer 104, by printing ink containing palladium particles on the board 100 on which the silver circuit layer is stacked, as in (b) of FIG. 4. Here, the process of printing ink containing palladium particles may be performed by inkjet printing, as in (a) of FIG. 4, and after printing the palladium circuit layer 106, it may be dried. As described above, the stacking effectiveness of the circuit layers may be increased by drying the ink after printing the ink corresponding to each circuit layer.

In (c) of FIG. 4, a palladium circuit layer 106 may be stacked on a silver circuit layer 104 and a silver circuit layer 104 may be stacked in turn on the palladium circuit layer 106. That is, a silver circuit layer 104 may be stacked and dried, by again printing the ink containing silver particles on the palladium circuit layer 106 stacked in process (b) of FIG. 4.

In (d) of FIG. 4, the silver circuit layer 104 and palladium circuit layer 106 may be stacked repeatedly until the circuit pattern is formed to a predetermined thickness. Thus, the alloy circuit may be formed to a predetermined thickness desired by the user. Here, it may be desirable that the stacking of each circuit layer be alternated per level so that the two types of metal can easily be bonded as an alloy by the sintering process.

In the case the present embodiment of the invention, if the circuit layer 104 and palladium circuit layer 106 are printed to a thickness of 500 nm each, in order to form an alloy circuit 10 μm in thickness, the silver circuit layer 104 and palladium circuit layer 106 will be stacked alternately ten times each.

However, the number of times each circuit layer is stacked may be different, as mentioned above, according to the ratio of the respective metal particles for forming the alloy. For example, when forming an alloy circuit using a copper circuit layer (not shown) containing copper particles and a palladium circuit layer containing palladium particles, the processes may be alternately repeated of stacking one copper circuit layer and two palladium circuit layers.

That is, the processes of stacking a silver circuit layer 104 on the board 100 once and stacking a palladium circuit layer 106 once may be repeated in alternation, or in another example, the processes of stacking a copper layer once and stacking a palladium circuit layer twice may be repeated in alternation.

In (e) of FIG. 4, the silver circuit layer 104 and palladium circuit layer 106 stacked in order may be sintered. To be more specific, by heating and pressing to a predetermined shape, the two types of circuit layers may be firmly fused together, thus forming an alloy circuit board 108 of a desired predetermined thickness.

The sintering process for forming the alloy circuit board 108 of this embodiment of the invention, may be to heat the silver circuit layers 104 and palladium circuit layers 106 stacked one after another such that they are melted altogether, so that the silver particles and palladium particles may readily be bonded to form the alloy circuit board 108. The sintering may be performed, for example, at a temperature of 250° C., at which both silver particles and palladium particles are molten.

However, the temperature conditions may be changed according to the types of metals and particle sizes, as already mentioned above. In an embodiment of the invention, if the sizes of the particles are small, in the order of nanometers, the temperature for the sintering process may be changed. By performing the sintering process at an appropriate temperature, the atoms positioned at the bonding regions between the silver circuit layers and palladium circuit layers may be activated to firmly bond with each other as alloys, whereby an alloy may be formed easily.

Figure 5:
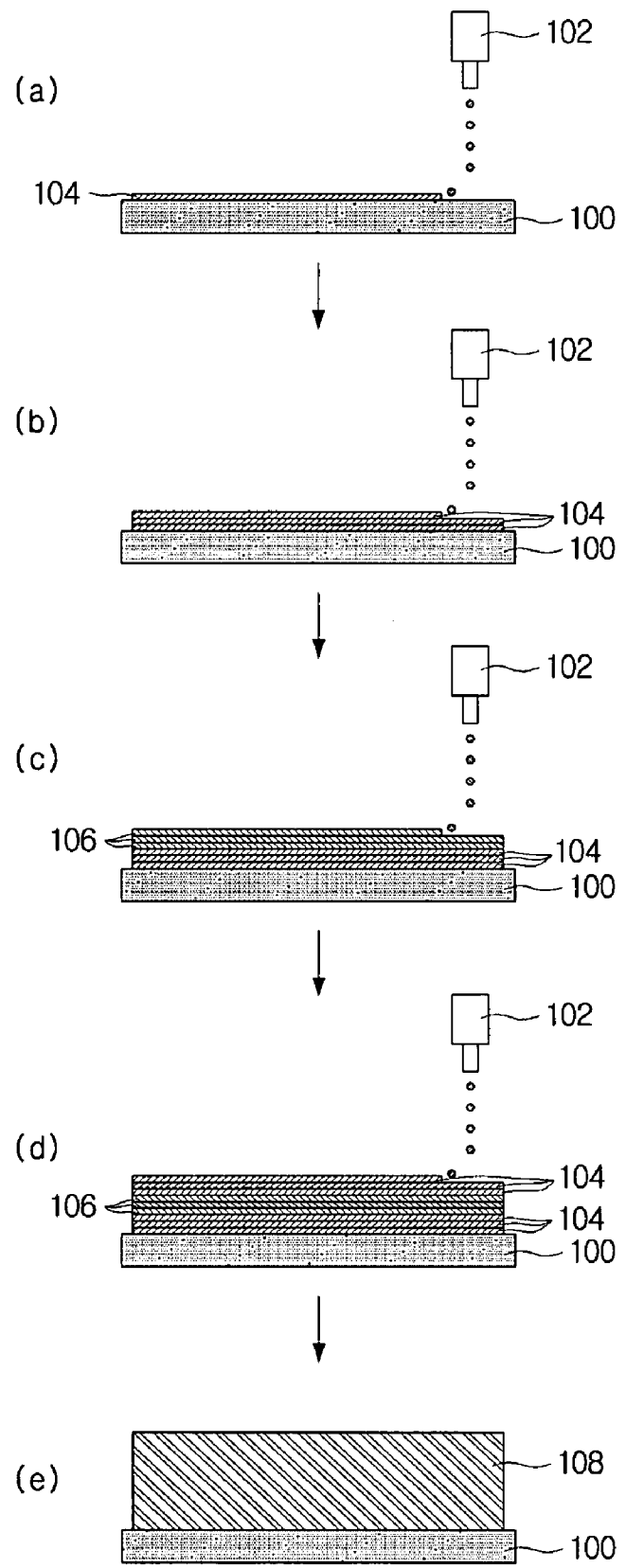
FIG. 5 is a flow diagram illustrating a process for manufacturing an alloy circuit board according to another embodiment of the present invention.

FIG. 5 is a flow diagram illustrating a process for manufacturing an alloy circuit board according to another embodiment of the present invention. In FIG. 5 are illustrated a board 100, an inkjet head 102, silver circuit layers 104, palladium circuit layers 106, and an alloy circuit board 108.

This embodiment of the invention differs from the embodiment illustrated in FIG. 4 in the method of stacking the silver circuit layer 104 containing silver particles and the palladium circuit layer 106 containing palladium particles on the board to form a circuit pattern of a predetermined thickness. In the following description, only those parts different from the embodiment of the invention illustrated in FIG. 4 will be explained in detail, and redundant explanations for those parts in common will be omitted.

In (b) of FIG. 5, multiple silver circuit layers 104 may be formed by printing a silver circuit layer 104 containing silver ink three times. In (c) of FIG. 5, three layers of palladium circuit layer 106 may be formed over the three layers of silver circuit layer 104, and in (d) of FIG. 5, three silver circuit layers 104 may be stacked again over the three palladium circuit layers 106. Of course, three additional palladium circuit layers 106 may be stacked over the layers, and the processes may be repeated sequentially.

Finally, in (e) of FIG. 5, the circuit layers formed in three layers each may be sintered collectively, to allow the silver particles and palladium particles to readily bond together at the regions where the silver circuit layers 104 and palladium circuit layers 106 are in contact, to form an alloy circuit board 108 containing silver particles and palladium particles.

An embodiment of the invention such as that illustrated in FIG. 5 may be applied in cases where the thickness of each circuit layer has to be increased by repeated printing because one instance of ink printing does not provide a circuit layer of the desired thickness, in cases where a particular type of metal particles are to be printed more because the components to be alloyed differ in ratio according to the type of ink, or in cases where the process is to be simplified to prevent it from becoming too complicated as an excessive number of printing is required. However, the method of printing the next ink after printing one type of ink several times may be applied within a range that allows proper alloy forming by the sintering process.

An alloy circuit board manufactured according to a method of manufacturing an alloy circuit board described above may have an alloy circuit formed by repeatedly printing an ink containing first metal particles and an ink containing second metal particles in alternation and then sintering. In this way, a desired alloy circuit may be formed using inkjet printing without having to use alloy ink, and the alloy circuit may be formed by an inexpensive process without the use of masks.

As set forth above, using a method of manufacturing an alloy circuit board according to certain embodiments of the invention, an alloy circuit of a desired predetermined thickness can be formed without using alloy ink, by printing types of ink each containing metal particles using inkjet printing, and the alloy circuit can be formed by an inexpensive process without the use of masks by using inkjet printing.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing an alloy circuit board including an alloy circuit made of an alloy of first metal particles and second metal particles, the method comprising:
   forming a first circuit layer by printing ink containing the first metal particles on a board;
   stacking a second circuit layer on the first circuit layer by printing ink containing the second metal particles on the board; and
   sintering the first circuit layer and the second circuit layer by heating so as to form the alloy of the first metal particles and the second metal particles.

2. The method of claim 1, wherein forming the first circuit layer is performed by inkjet printing.

3. The method of claim 1, wherein stacking the second circuit layer is performed by inkjet printing.

4. The method of claim 1, wherein forming the first circuit layer comprises drying the ink containing the first metal particles.

5. The method of claim 1, wherein stacking the second circuit layer comprises drying the ink containing the second metal particles.

6. The method of claim 1, wherein forming the first circuit layer and stacking the second circuit layer are sequentially repeated, prior to the sintering.

7. The method of claim 1, wherein forming the first circuit layer and stacking the second circuit layer are performed multiple times.

8. The method of claim 1, wherein a thickness of the first circuit layer is 100 to 1,000 nm.

9. The method of claim 1, wherein a thickness of the second circuit layer is 100 to 1,000 nm.

10. The method of claim 1, wherein the sintering comprises heating the first circuit layer and the second circuit layer to a temperature of 200 to 400° C.

* * * * *